United States Patent
Saito et al.

(10) Patent No.: US 8,643,091 B2
(45) Date of Patent: Feb. 4, 2014

(54) SEMICONDUCTOR DEVICE

(75) Inventors: Wataru Saito, Kanagawa-ken (JP);
Syotaro Ono, Kanagawa-ken (JP);
Shunji Taniuchi, Kanagawa-ken (JP);
Miho Watanabe, Miyagi-ken (JP);
Hiroaki Yamashita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 436 days.

(21) Appl. No.: 13/052,028

(22) Filed: Mar. 18, 2011

(65) Prior Publication Data

US 2012/0056262 A1 Mar. 8, 2012

(30) Foreign Application Priority Data

Sep. 7, 2010 (JP) .................. 2010-200251

(51) Int. Cl.
*H01L 29/78* (2006.01)
*H01L 21/336* (2006.01)

(52) U.S. Cl.
USPC ............. 257/330; 257/E29.262; 257/E21.41; 438/270

(58) Field of Classification Search
USPC ................... 257/330–334, E29.262, E21.41; 438/270–272
See application file for complete search history.

(56) References Cited

U.S. PATENT DOCUMENTS

| | | | |
|---|---|---|---|
| 4,941,026 A | 7/1990 | Temple | |
| 5,072,269 A | 12/1991 | Hieda | |
| 5,688,725 A | 11/1997 | Darwish et al. | |
| 7,605,426 B2 * | 10/2009 | Saito et al. | 257/330 |
| 7,755,138 B2 | 7/2010 | Saito et al. | |
| 2006/0145230 A1 | 7/2006 | Omura et al. | |
| 2009/0090966 A1 * | 4/2009 | Thorup et al. | 257/328 |

FOREIGN PATENT DOCUMENTS

| | | |
|---|---|---|
| JP | 2006-202931 | 8/2006 |
| WO | 2009/046210 A1 | 4/2009 |

OTHER PUBLICATIONS

Japanese Office Action dated Jan. 16, 2013, filed in Japanese counterpart Application No. 2010-200251, 6 pages (in English and Japanese).

* cited by examiner

*Primary Examiner* — Julio J Maldonado
*Assistant Examiner* — Daniel Shook
(74) *Attorney, Agent, or Firm* — Patterson & Sheridan, LLP

(57) ABSTRACT

A semiconductor device includes first, second, third, and fourth semiconductor layers of alternating first and second conductivity types, an embedded electrode in a first trench that penetrates through the second semiconductor layer, a control electrode above the embedded electrode in the first trench, and first and second main electrodes. The fourth semiconductor layer is selectively provided in the first semiconductor layer and is connected to a lower end of a second trench, which penetrates through the second semiconductor layer. The first main electrode is electrically connected to the first semiconductor layer, and the second main electrode is in the second trench and electrically connected to the second, third, and fourth semiconductor layers. The embedded electrode is electrically connected to the second main electrode or the control electrode. A Shottky junction formed of the second main electrode and the first semiconductor layer is formed at a sidewall of the second trench.

20 Claims, 12 Drawing Sheets

SEMICONDUCTOR DEVICE

CROSS-REFERENCE TO RELATED APPLICATIONS

This application is based upon and claims the benefit of priority from the prior Japanese Patent Application No. 2010-200251, filed on Sep. 7, 2010; the entire contents of which are incorporated herein by reference.

FIELD

Embodiments described herein relate generally to a semiconductor device.

BACKGROUND

As an example of power semiconductor devices, there is a power MOSFET (Metal Oxide Semiconductor Field Effect Transistor) of a vertical electrode structure. To reduce on-resistance in such power MOSFET, a power MOSFET of a field plate structure in which a deep trench is formed in a drift layer and an embedded electrode is formed in the trench via an insulating film is used. The field plate structure is provided periodically in the drift layer, and a depletion layer is extended from the field plate structure in a lateral direction of the drift layer when a voltage is applied. Thereby, a high breakdown voltage is maintained. As a result, in this power MOSFET, the impurity concentration of the drift layer can be made higher than that of the conventional power MOSFET, and a low on-resistance that exceeds the material limit is realized.

On the other hand, the power MOSFET of the vertical electrode structure has a pn diode (built-in diode) formed of a base layer, a drift layer and a drain layer. To realize a high-speed built-in diode, a Schottky barrier diode (SBD) using a Shottky junction may be built into the semiconductor device.

However, when forming the Schottky barrier diode in a basic unit cell of the power MOSFET, a cell unit (period in a lateral direction of the cell) of the region where the Shottky junction is formed become larger. For the power MOSFET having the field plate structure, the longer the period in the lateral direction is, the more the on-resistance is raised. Moreover, the longer the period in the lateral direction is, the more the electric field strength at the Schottky junction is enhanced, and there is a possibility that leakage current is increased by the Schottky barrier diode.

DETAILED DESCRIPTION

Figure 1:
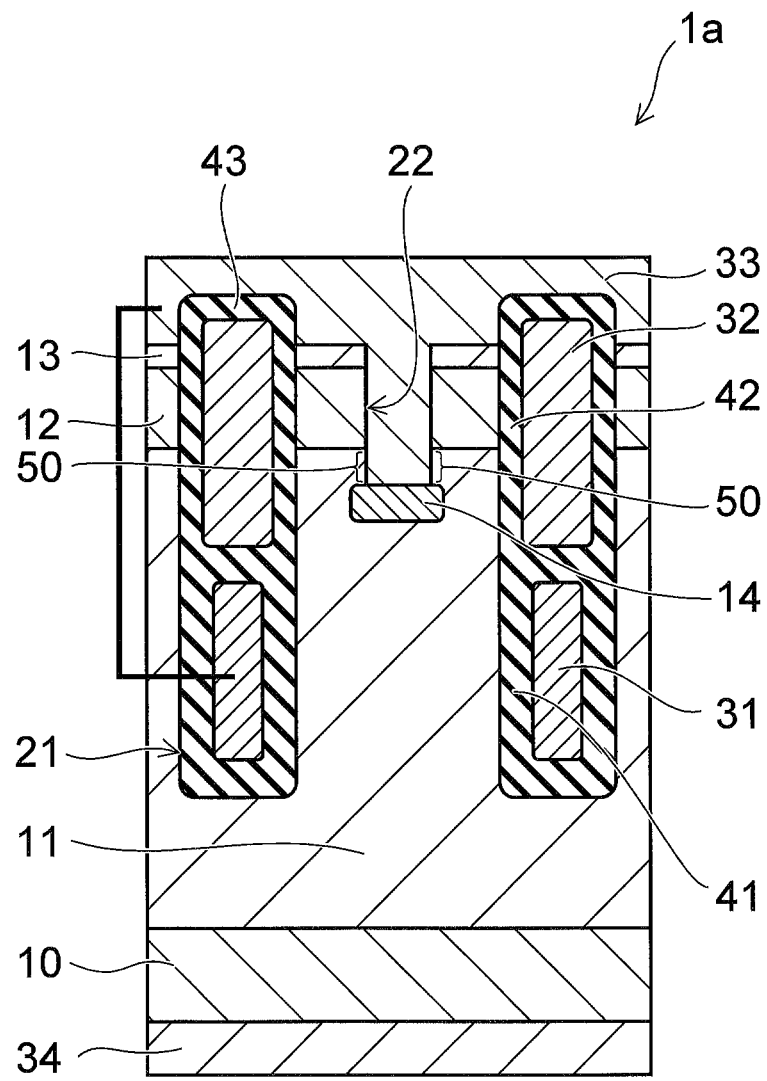
FIG. 1 is a schematic cross-sectional view of a main part of a semiconductor device according to a first embodiment.

In general, according to one embodiment, a semiconductor device includes a first semiconductor layer of a first conductivity type, a second semiconductor layer of a second conductivity type, a third semiconductor layer of the first conductivity type, an embedded electrode, a control electrode, a fourth semiconductor layer of the second conductivity type, a first main electrode, and a second main electrode. The second semiconductor layer is provided on the first semiconductor layer. The third semiconductor layer is provided on the second semiconductor layer. The embedded electrode is provided in a first trench via a first insulating film. The first trench penetrates through the second semiconductor layer from a surface of the third semiconductor layer to reach the first semiconductor layer. The control electrode is provided above the embedded electrode via a second insulating film in the first trench. The fourth semiconductor layer is selectively provided in the first semiconductor layer and is connected to a lower end of a second trench. The second trench penetrates through the second semiconductor layer from the surface of the third semiconductor layer to reach the first semiconductor layer. The first main electrode is electrically connected to the first semiconductor layer. The second main electrode is provided in the second trench and connected to the second semiconductor layer, the third semiconductor layer and the fourth semiconductor layer. The embedded electrode is electrically connected to one of the second main electrode and the control electrode. A Schottky junction formed of the second main electrode and the first semiconductor layer is formed at a sidewall of the second trench.

Embodiments will now be described with reference to the drawings.

In the following embodiments, by way of an example, the first conductivity type is taken as an n-type, and the second conductivity type is taken as a p-type. Similar components in the drawings are marked with like reference numerals.

First Embodiment

FIG. 1 is a schematic cross-sectional view of a main part of a semiconductor device according to a first embodiment. FIG. 1 illustrates a device portion of the semiconductor device. FIGS. 2A to 9 described below also illustrate the device portion of the semiconductor device.

A semiconductor device is includes a power MOSFET having a vertical electrode structure and a Schottky barrier diode (hereinafter referred to as SBD). In the semiconductor device 1a, as shown in FIG. 1, an n$^-$-type drift layer (first semiconductor layer) 11 is provided on an n$^+$-type drain layer 10. A p-type base layer (second semiconductor layer) 12 is provided on the surface of the drift layer 11. An n$^+$-type source layer (third semiconductor layer) 13 is provided on the surface of the base layer 12. In the embodiment, the drain layer 10 side is taken as the lower side, and the source layer 13 side is taken as the upper side. Namely, the source layer 13 is located at a position shallower than the drain layer 10.

A plurality of trenches 21 is provided from the surface of the source layer 13 toward the drift layer 11. For example, the trenches 21 penetrate through the base layer 12 from the surface of the source layer 13 to reach the inside of the drift layer 11. For example, the trenches 21 are respectively provided periodically in a direction substantially parallel to the major surface of the drift layer 11. The trenches 21 extend in parallel to one another.

An embedded insulating film (first insulating film) 41 and an embedded electrode 31 are provided at a lower portion in the trench 21. A gate insulating film (second insulating film) 42 and a gate electrode (control electrode) 32 are provided at an upper portion in the trench 21. The embedded electrode 31 has an embedded field plate structure (hereinafter referred to as an embedded FP structure), which is insulated from the drift layer 11 and the gate electrode 32 by the embedded insulating film 41. The embedded electrode 31 is in contact with the drift layer 11 via the embedded insulating film 41. The embedded insulating film 41 has a film thickness thicker than that of the gate insulating film 42.

The gate electrode 32 is in contact with the drift layer 11, the base layer 12 and the source layer 13 via the gate insulating film 42.

The drain layer 10 is provided on the back surface of the drift layer 11 and is connected to the drain electrode (first main electrode) 34. The base layer 12 and the source layer 13 are connected to the source electrode (second main electrode) 33 provided on the source layer 13. The source electrode 33 and the gate electrode 32 are insulated by an interlayer insulating film 43 provided in an upper portion of the gate electrode 32. The embedded electrode 31 is electrically connected to the source electrode 33.

A trench 22 that extends from the surface of the source layer 13 and reaches the drift layer 11 is formed between the adjacent gate electrodes 32. The trench 22 divides the source layer 13 from the base layer 12. The lower end of the trench 22 is located at a position deeper than the bottom surface of the base layer 12 and at a position shallower than the bottom surface of the gate electrode 32. The source electrode 33 is embedded in the trench 22.

A P$^+$-type guard ring layer (fourth semiconductor layer) 14 is in contact with the lower end of the trench 22. The guard ring layer 14 is connected to the source electrode 33 provided in the trench 22.

In a part of the sidewall of the trench 22, a metallic source electrode 33 contacts the n$^-$-type drift layer 11. As a result, a Schottky junction 50 is formed in a portion where the trench 22 is in contact with the drift layer 11. Namely, the semiconductor device 1a incorporates therein the SBD formed of the source electrode 33 and the drift layer 11. This SBD is connected between the source electrode 33 and the drain electrode 34.

A main component of the drift layer 11, the base layer 12, the source layer 13, the drain layer 10 and the guard ring layer 14 is silicon (Si), for example. A main component of the embedded electrode 31 and the gate electrode 32 is polysilicon (poly-Si), for example. A main component of the source electrode 33 and the drain electrode 34 is aluminum (Al), for example. A main component of the embedded insulating film 41, the gate insulating film 42, and the interlayer insulating film 43 is silicon oxide (SiO$_2$), for example.

Next, manufacturing processes of the embodiment will be described by way of one example.

FIGS. 2A to 4B are schematic cross-sectional views of main parts for illustrating manufacturing processes of the semiconductor device according to the first embodiment.

Figure 2A:
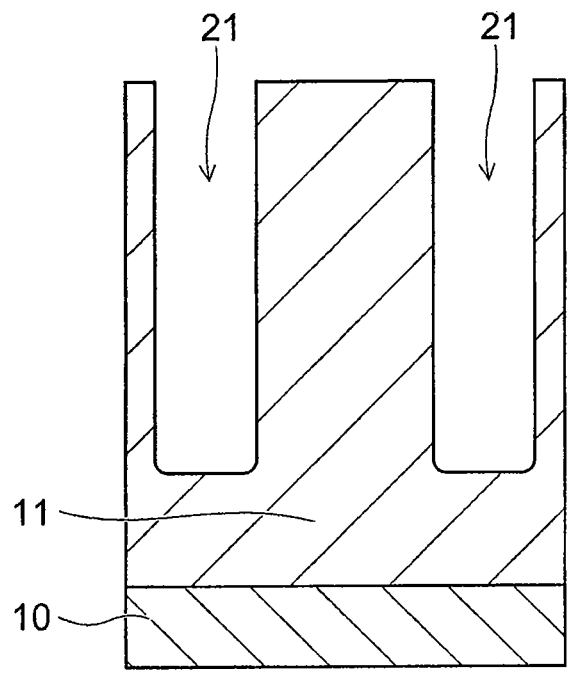
FIGS. 2A and 2B are schematic cross-sectional views of main parts illustrating manufacturing processes of the semiconductor device according to the first embodiment.

First, as shown in FIG. 2A, the substrate-like (for example, semiconductor wafer-like) n$^+$-type drain layer 10 is prepared. Then, the n$^-$-type drift layer 11 is epitaxially grown on the surface of the drain layer 10. Next, a plurality of trenches 21 is formed selectively in the drift layer 11 by using the anisotropic etching (for example, Reactive Ion Etching, RIE) or the like after the mask formed of a silicon oxide film, a resist and the like (not shown) is selectively formed on the surface of the drift layer 11.

Figure 2B:
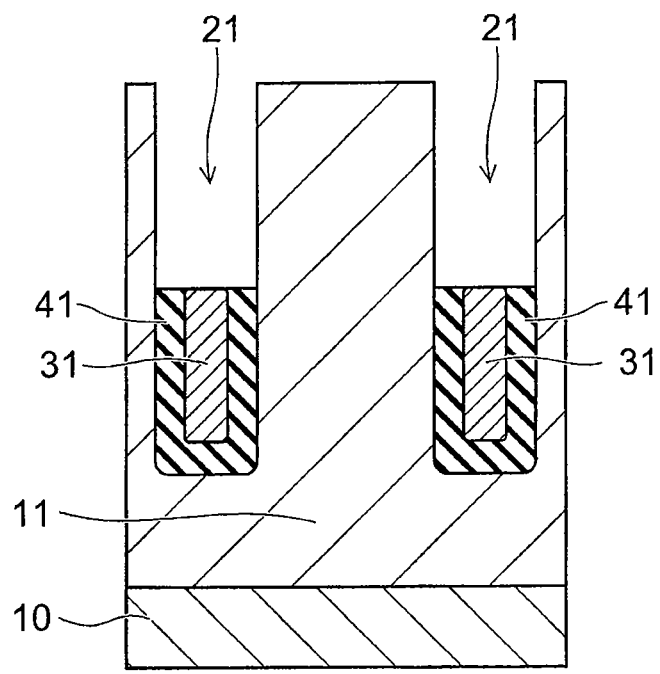

Next, as shown in the FIG. 2B, the embedded insulating film 41 is formed in the trench 21 by using the thermal oxidation method, the chemical vapor deposition (CVD) method or the like. A material of the embedded insulating film 41 is, for example, silicon oxide (SiO$_2$), silicon nitride (Si$_3$N$_4$) or the like. Thereafter, polysilicon (poly-Si) is embedded in the trench 21 via the embedded insulating film 41. The formation method of polysilicon is, for example, the CVD method. Thereafter, polysilicon embedded in the trench 21 and the insulating film are etched back. As a result, the embedded electrode 31 is formed in the lower portion of the trench 21 via the embedded insulating film 41.

Figure 3A:
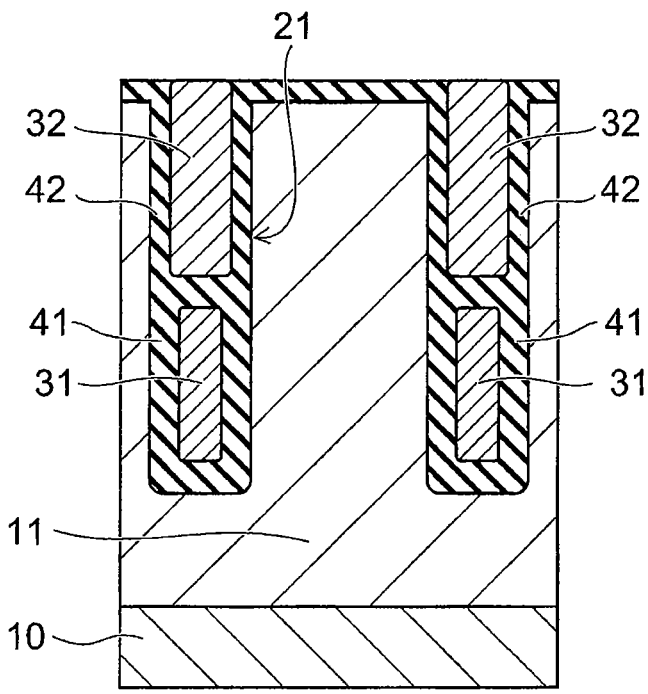
FIGS. 3A and 3B are schematic cross-sectional views of main parts illustrating manufacturing processes of the semiconductor device according to the first embodiment.

Next, as shown in FIG. 3A, the gate insulating film 42 is formed in the trench 21 by using the thermal oxidation method, the CVD method, or the like. Next, the polysilicon is embedded via the gate insulating film 42 by the CVD method. Next, the polysilicon and the gate insulating film 42 are etched back to form the gate electrode 32. As a result, the gate electrode 32 is formed on the embedded electrode 31.

Figure 3B:
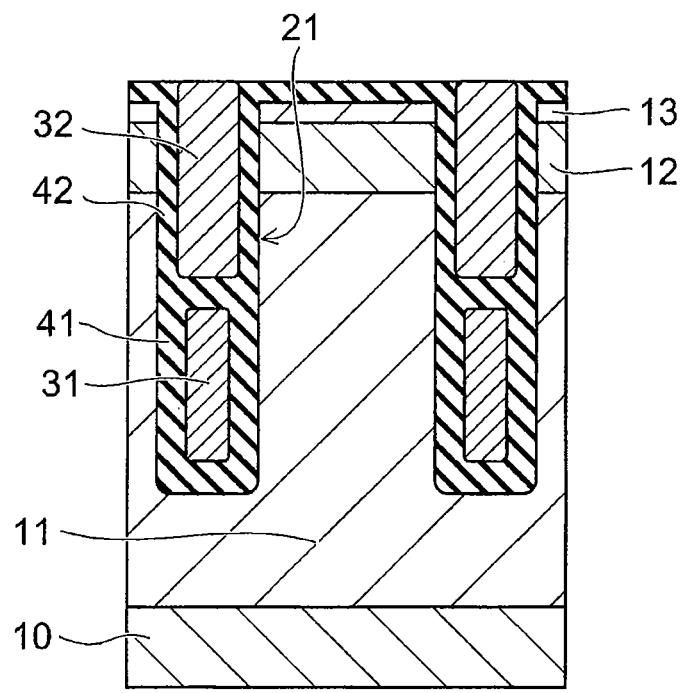

Next, as shown in FIG. 3B, the p-type base layer 12 is formed on the surface of the drift layer 11 by the ion-implantation and the heat-treatment. Thereafter, the n$^+$-type source layer 13 is formed on the surface of the base layer 12 by the ion-implantation and the heat-treatment. In this state, the insulating film and the resist layer, or the like may be covered as necessary for the portion where the ion implantation is not required.

Figure 4A:
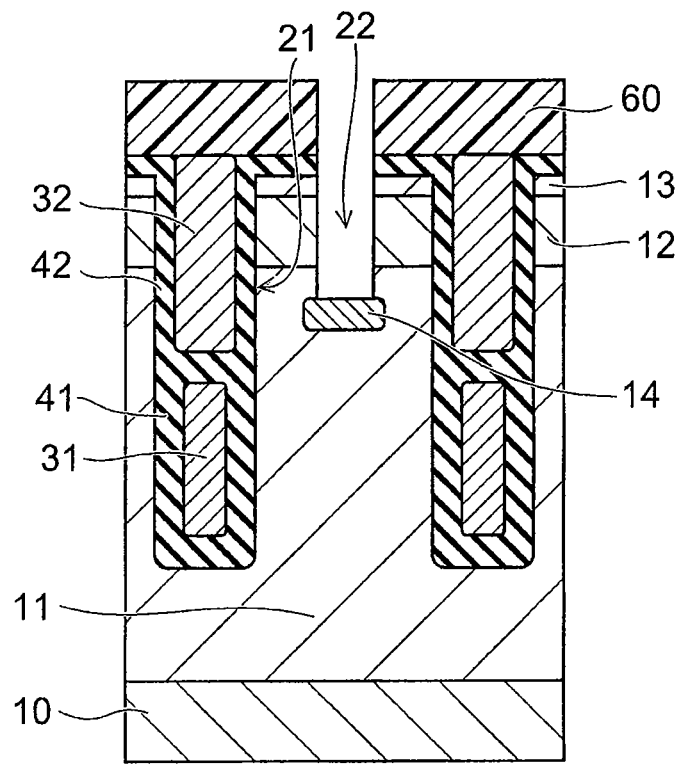
FIGS. 4A and 4B are schematic cross-sectional views of main parts illustrating manufacturing processes of the semiconductor device according to the first embodiment.

Next, as shown in the FIG. 4A, after selectively forming a mask 60 formed of a silicon oxide film, a resist layer and the like on the surface of the source layer 13, the trench 22 is formed by the RIE method or the like. Furthermore, p-type impurities are implanted from the bottom surface (lower end) of the trench 22 into the drift layer 11 on the lower side of the bottom surface by the ion-implantation. After implanting the p-type impurities, heat treatment is performed as necessary. As a result, the guard ring layer 14 in contact with the bottom surface (lower end) of the trench 22 is formed.

Figure 4B:
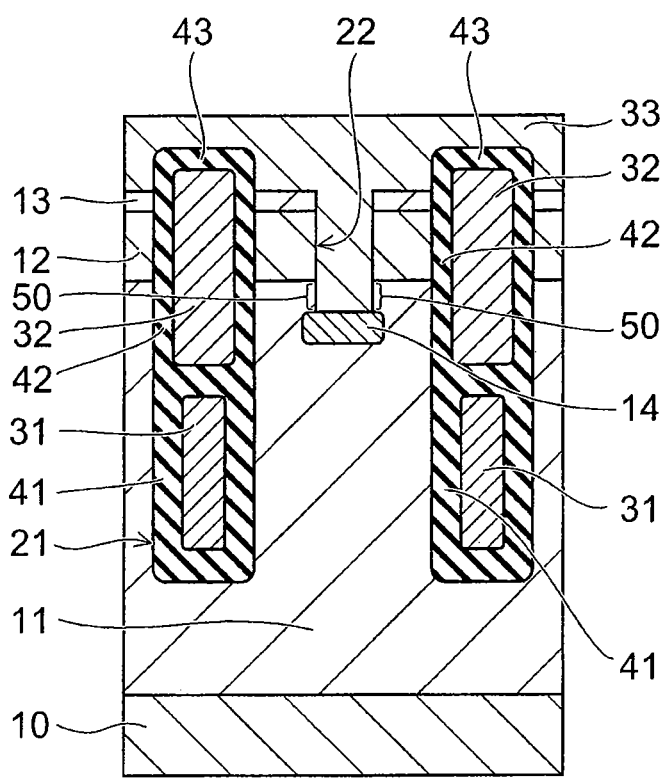

Next, as shown in FIG. 4B, the surface of the gate electrode 32 projected from the surface of the source layer 13 is covered with the interlayer insulating film 43. Furthermore, a metal layer is formed in the trench 22 by using the sputter method or the CVD method, and the source electrode 33 is formed on the source layer 13. The source electrode 33 and the metal layer embedded in the trench 22 are communicated with each other, and thus the source electrode 33 herein indicates the source electrode including the metal layer.

A main component of the source electrode 33 is aluminum (Al), for example. A barrier film (for example, a film including titanium (Ti) as a main component) may be formed between the metal layer and the inner wall of the trench 22 as necessary. Furthermore, the back surface side of the drain layer 10 is ground as necessary, and the drain electrode 34 is formed on the lower side of the drain layer 10. With the foregoing manufacturing processes, the semiconductor device 1a shown in FIG. 1 is formed.

Next, the functional effect of the semiconductor device 1a will be described.

The semiconductor device 1a shown in FIG. 1 includes the embedded FP structure and the SBD. The MOSFET including the source layer 13, the drain layer 10 and the gate electrode 32, and the SBD are connected in parallel between the source electrode 33 and the drain electrode 34. The source electrode 33 functions as an anode electrode of the SBD, and the drain electrode 31 functions as a cathode electrode.

When a threshold voltage or higher is applied to the gate electrode 32 in the state where the source electrode 33 is set in a lower potential than the drain electrode 34, a channel (inversion layer) is formed in the base layer 12 opposed to the gate electrode 32 via the gate insulating film 42, and the electric connection between the source electrode 33 and the drain electrode 34 are conducted.

As a result, the MOSFET is set in the on state, and for example, electron current flows from the source electrode 33 to the drain electrode 34 via the source layer 13, the channel, the drift layer 11 and the drain layer 10.

On the other hand, when the potential of the gate electrode 32 is set to a potential lower than the threshold voltage, the channel is not formed in the base layer 12, and the MOSFET is set in the off state. When the MOSFET is in the off state, a high voltage is applied across the source electrode 33 and the drain electrode 34. Therefore, the depletion layer extends from the embedded insulating film 41 electrically connected to the source electrode 33 toward the drift layer 11. Namely, the depletion layer extends in a lateral direction of the semiconductor device 1a (direction substantially parallel to the major surface of the drain layer 10), and, the depletion layers that respectively extend from the adjacent embedded insulating films 41 are connected. As a result, the semiconductor device 1a maintains a high breakdown voltage.

Moreover, the film thickness of the embedded insulating film 41 is sufficiently thicker than that of the gate insulating film 42a, and thus a high breakdown voltage is maintained by the embedded insulating film 41. Accordingly, the impurity concentration of the drift layer 11 can be increased and the on-resistance can be reduced. Furthermore, the shorter the period in the lateral direction is, the more the drift layer 11 is likely to be depleted. Accordingly, the impurity concentration of the drift layer 11 can be further increased. As a result, the on-resistance of the semiconductor device 1a further decreases.

When the MOSFET is in the off state, and the source electrode 33 has a higher potential than the drain electrode 34, the SBD operates, and forward current flows from the source electrode 33 via the Schottky junction 50 to the drain electrode 34 through the drift layer 11 and the drain layer 10.

A semiconductor device 100 according to a comparative example will be described.

Figure 5:
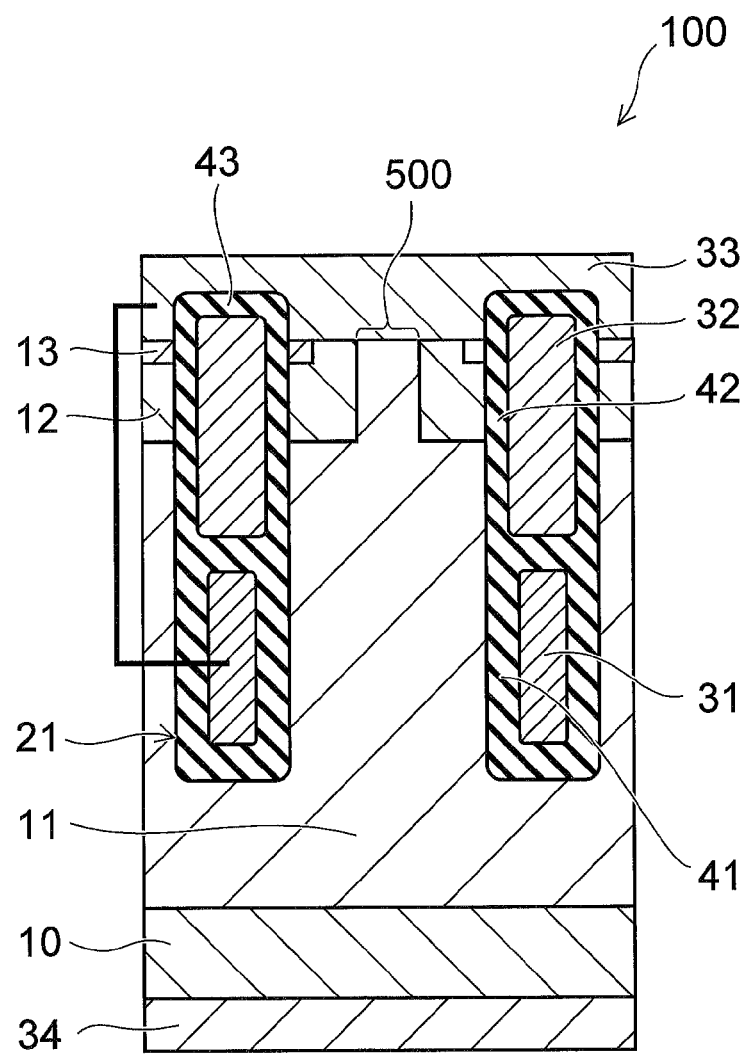
FIG. 5 is a schematic cross-sectional view of a main part of a semiconductor device according to a comparative example.

FIG. 5 is a schematic cross-sectional view of a main part of the semiconductor device 100 according to the comparative example.

In the semiconductor device 100 of the comparative example, the source layer 13, the base layer 12 and the drift layer 11 are connected to the bottom surface of the source electrode 33. The semiconductor device 100 does not have the source electrode 33 embedded in the trench 22, and the guard ring layer 14 as provided in the semiconductor device 1a. The semiconductor device 100 has the Schottky junction 500 formed in a part of the surface of the drift layer 11.

In the semiconductor device 100, the Schottky junction 500 faces the drain electrode 34. Therefore, when a high voltage is applied to the drain electrode 34, an electric field is strongly applied to the Schottky junction 500. Therefore, a leakage current may be generated at the Schottky junction 500.

In order to suppress a leakage current at the Schottky junction 500, it is required to select a material with high Schottky barrier. However, since the height of the Schottky barrier raises a forward voltage of the SBD, it is difficult to promote a reduction in loss of the SBD.

In order to reduce the on-voltage of the SBD of the semiconductor device 100, it is required to increase an area of the Schottky junction 500. In the semiconductor device 100, the Schottky junction 500 is provided so as to face the drain electrode 34, and the major surface of the drain layer 10 and the surface of the Schottky junction are arranged substantially parallel to one another. For this reason, when the area of Schottky junction 500 is increased, the distance between the adjacent embedded electrodes 31 becomes longer. Thus, it is difficult to reduce a cell pitch in the semiconductor device 100. As a result, in the semiconductor device 100, it is difficult to realize a shorter cycle in the lateral direction while reducing the on-resistance.

In contrast, in the semiconductor device 1a of the embodiment, the Schottky junction 50 faces the gate electrode 32, and does not face the drain electrode 34. Therefore, the Schottky junction 50 has a surface (interface) in a direction not perpendicular to the current path but substantially parallel to a direction along the current path. Therefore, even if a high voltage is applied across the source electrode 33 and the drain electrode 34, the electric filed strength applied to the Schottky junction 50 is suppressed as compared to the semiconductor device 100 according to the comparative example. Moreover, since the electric field strength is moderated more by the guard ring layer 14, the electric field strength applied to the Schottky junction 50 becomes almost zero. Furthermore, the Schottky junction 50 is located at a position shallower than the bottom surface (lower end) of the gate electrode 32. With this structure, the electric field strength applied to the Schottky junction 50 is difficult to be increased. Thus, a backward leakage current flowing in the Schottky junction 50 is suppressed. As a result, the performance of the SBD of the semiconductor device 1a becomes more desirable.

Moreover, in the semiconductor device 1a, the face of the Schottky junction 50 and the major surface of the drain layer 10 are arranged in a direction substantially perpendicular to one another, the cycle in the lateral direction is not made longer by the formation of the Schottky junction 50 itself. Furthermore, by forming the trench 22 deeper, it is possible to increase the area of Schottky junction 50. Therefore, it is possible to obtain a desirable Schottky junction area without increasing the cycle in the lateral direction in the basic unit cell. As a result, the on-voltage of the SBD can be reduced by increasing the area of the SBD while ensuring the low on-resistance of the MOSFET.

Additionally, in the semiconductor device 1a, since the embedded electrode 31 is connected to the source electrode 33, the gate-to-drain capacitance can be reduced, thereby realizing a high speed switching.

As described above, a vertical power MOSFET incorporating an SBD of small backward leakage current can be realized while ensuring a low on-resistance.

Next, a variation of the semiconductor device 1a will be described.

First Variation of First Embodiment

Figure 6:
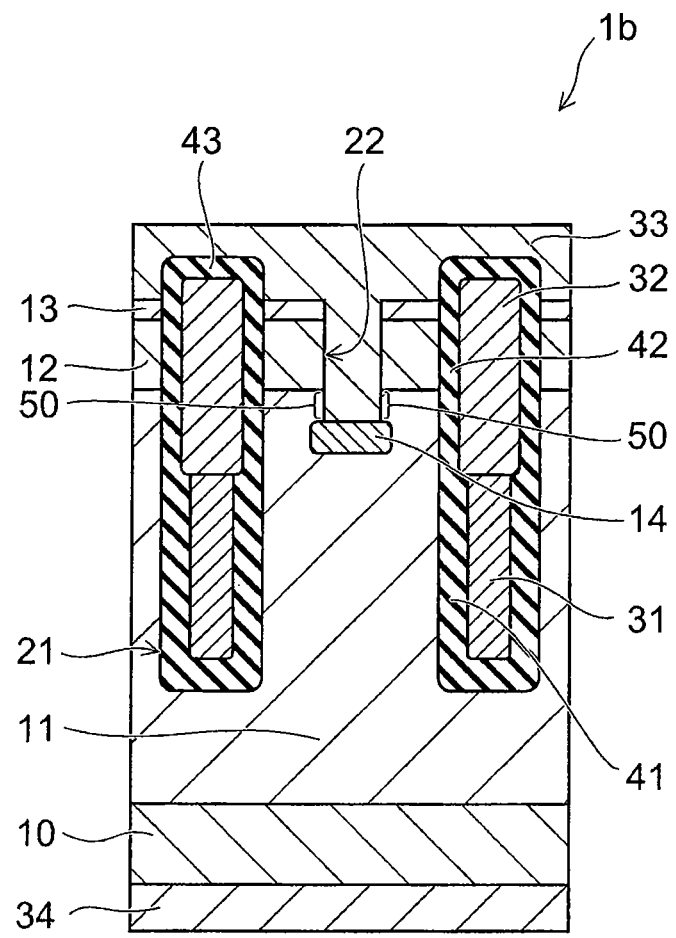
FIG. 6 is a schematic cross-sectional view of a main part of a semiconductor device according to a first variation of the first embodiment.

FIG. 6 is a schematic cross-sectional view of a main part of a semiconductor device according to a first variation of the first embodiment. In a semiconductor device 1b according to the variation of the first embodiment, in the trench 21, a embedded electrode 31 is connected to the gate electrode 32.

With the foregoing structure, in the on-state of the MOSFET, an electron accumulation layer can be formed also in the drift layer 11 facing the embedded electrode 31 via the embedded insulating film 41. Thus, in the semiconductor device 1b, a channel density increases, and the on-resistance is reduced further as compared to the semiconductor device 1a.

Second Variation of First Embodiment

Figure 7:
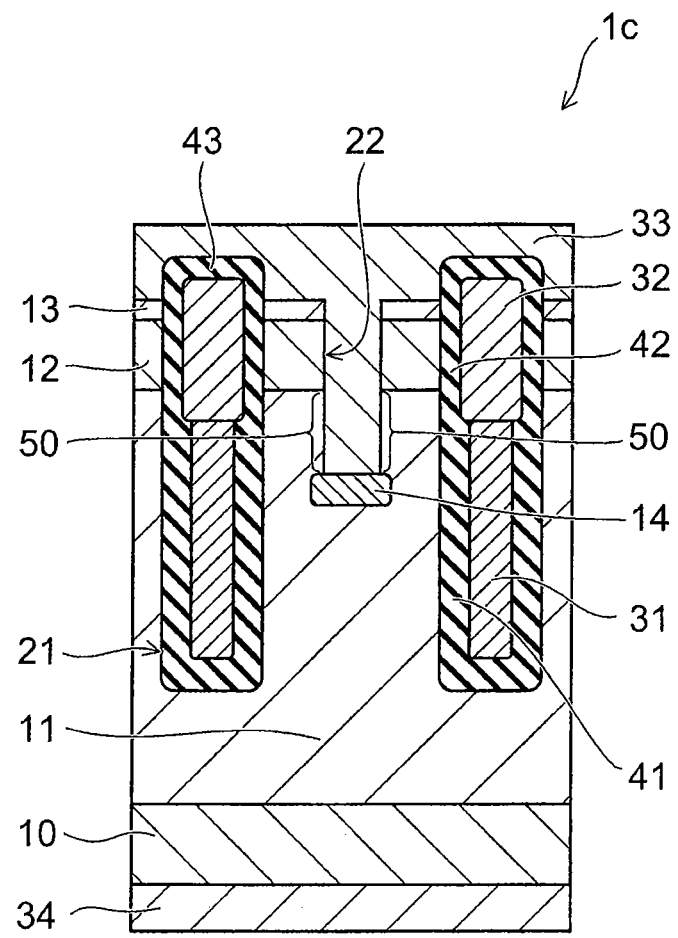
FIG. 7 is a schematic cross-sectional view of a main part of a semiconductor device according to a second variation of the first embodiment.

FIG. 7 is a schematic cross-sectional view of a main part of a semiconductor device according to a second variation of the first embodiment.

In a semiconductor device 1c, the lower end of trench 22 is located at a position deeper than the lower end of the gate electrode 32.

With the foregoing structure, the area of the Schottky junction 50 extends more than the semiconductor devices 1a and 1b. Therefore, the on-voltage of the SBD is further decreased. Moreover, since the guard ring layer 14 is located at a position deeper than the gate insulating film 42, it is possible to moderate the electric field strength applied to the gate insulating film 42 when applying a high voltage across the source electrode 33 and the drain electrode 34. As a result, in the semiconductor device 1c, deterioration (insulation breakdown, for instance) in the gate insulating film 42 is suppressed, and the reliability is improved as compared to the semiconductor devices 1a and 1b.

Second Embodiment

Figure 8:
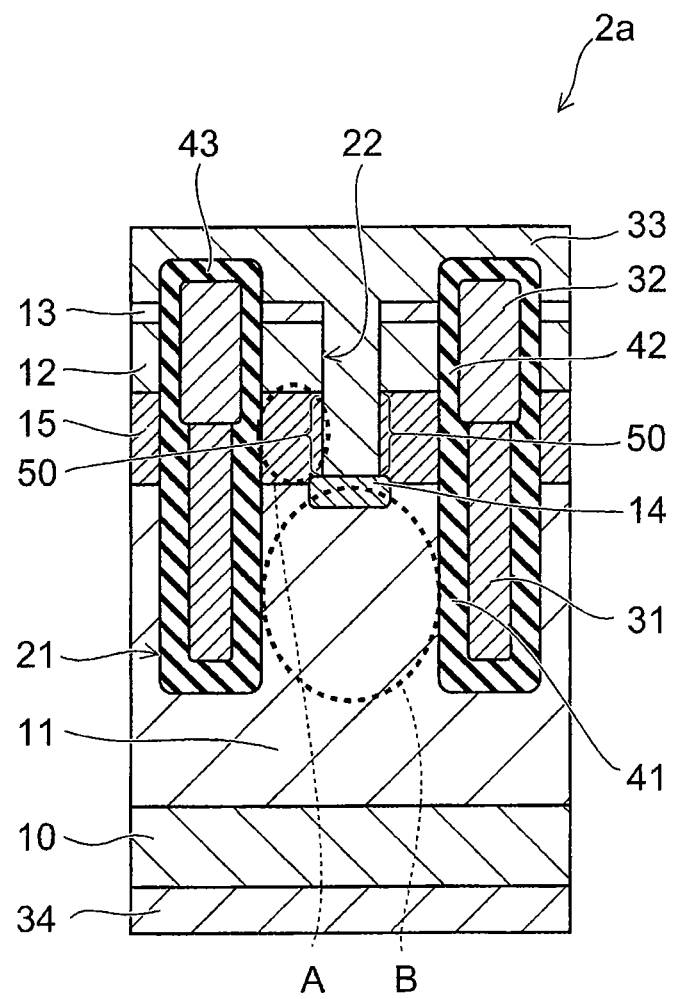
FIG. 8 is a schematic cross-sectional view of a main part of a semiconductor device according to a second embodiment.

FIG. 8 is a schematic cross-sectional view of a main part of a semiconductor device according to a second embodiment.

As shown in FIG. 8, in a semiconductor device 2a, an n-type semiconductor layer (fifth semiconductor layer) 15 of high concentration containing impurities having concentration higher than that of the drift layer is provided in a region A on the lower side of the base layer 12, and between the trench 21 and the trench 22. The lower end of the high concentration semiconductor layer 15 is located at a position shallower than the lower end of the guard ring layer 14. The impurity concentration of the high concentration semiconductor layer 15 is around several times of the impurity concentration of the drift layer 11. A main component of the high concentration semiconductor layer 15 is silicon (Si), for example. A metallic source electrode 33 contacts the high concentration semiconductor layer 15 in a part of the sidewall of the trench 22. As a result, the Schottky junction 50 is formed in the portion where the trench 22 contacts the high concentration semiconductor layer 15. Other than the above, the semiconductor device 2a has the same configuration as that of the semiconductor device 1c.

With the foregoing structure, the depletion layer extends from the gate insulating film 42 and the buried insulating film 41 in a lateral direction when a voltage is applied to the drain electrode 34, and the depletion layer also extends from the Schottky junction 50 in a lateral direction. Therefore, the region A sandwiched between the Schottky junction 50 and the trench 21 is more likely to be depleted than a region B between the trenches 21. As a result, it is possible to increase the impurity concentration of the region A without reducing the breakdown voltage. Therefore, the breakdown voltage of the semiconductor device 2a is not reduced even in the case where the high concentration semiconductor layer 15 is provided. By providing the high concentration semiconductor layer 15 of high impurity concentration in the drift layer 11, the MOSFET of still lower on-resistance can be realized.

Variation of Second Embodiment

Next, a variation of the semiconductor device 2a will be described.

Figure 9:
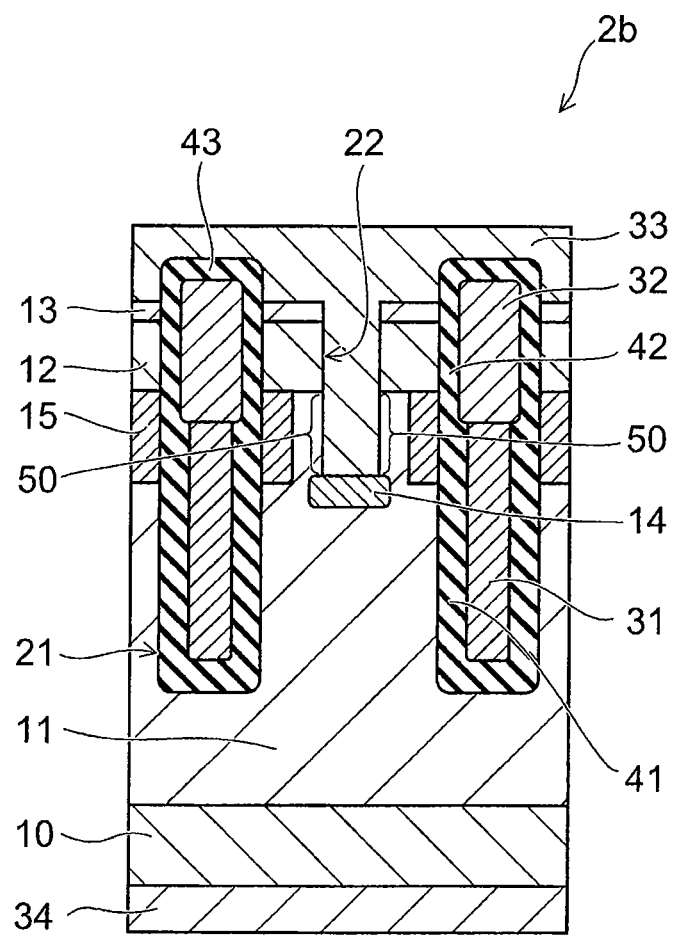
FIG. 9 is a schematic cross-sectional view of a main part of a semiconductor device according to a variation of the second embodiment.

FIG. 9 is a schematic cross-sectional view of a main part of a semiconductor device according to a variation of the second embodiment.

As shown in FIG. 9, in a semiconductor device 2b, the high concentration semiconductor layer 15 is not in contact with the trench 22. A metallic source electrode 33 contacts the drift layer 11 in a part of the sidewall of the trench 22. As a result, the Schottky junction 50 is formed in the portion where the trench 22 contacts the drift layer 11. Other than the above, the semiconductor device 2b has the same configuration as that of the semiconductor device 2a.

With the foregoing structure of the semiconductor device 2b, by the depletion layer that extends from the Schottky junction 50, the impurity concentration of the drift layer is increased, and a low on-resistance can be realized without decreasing the breakdown voltage as in the case of the semiconductor device 2a. Since the semiconductor layer having formed therein the Schottky junction 50 is the drift layer 11, the impurity concentration is lower as compared to the semiconductor device 2a. As a result, it is possible to suppress a leakage current that flows in the drift layer 11 via the SBD. In the semiconductor device 2b, a reduction in the on-resistance and the SBD of lower leakage current can be realized.

Third Embodiment

Figure 10:
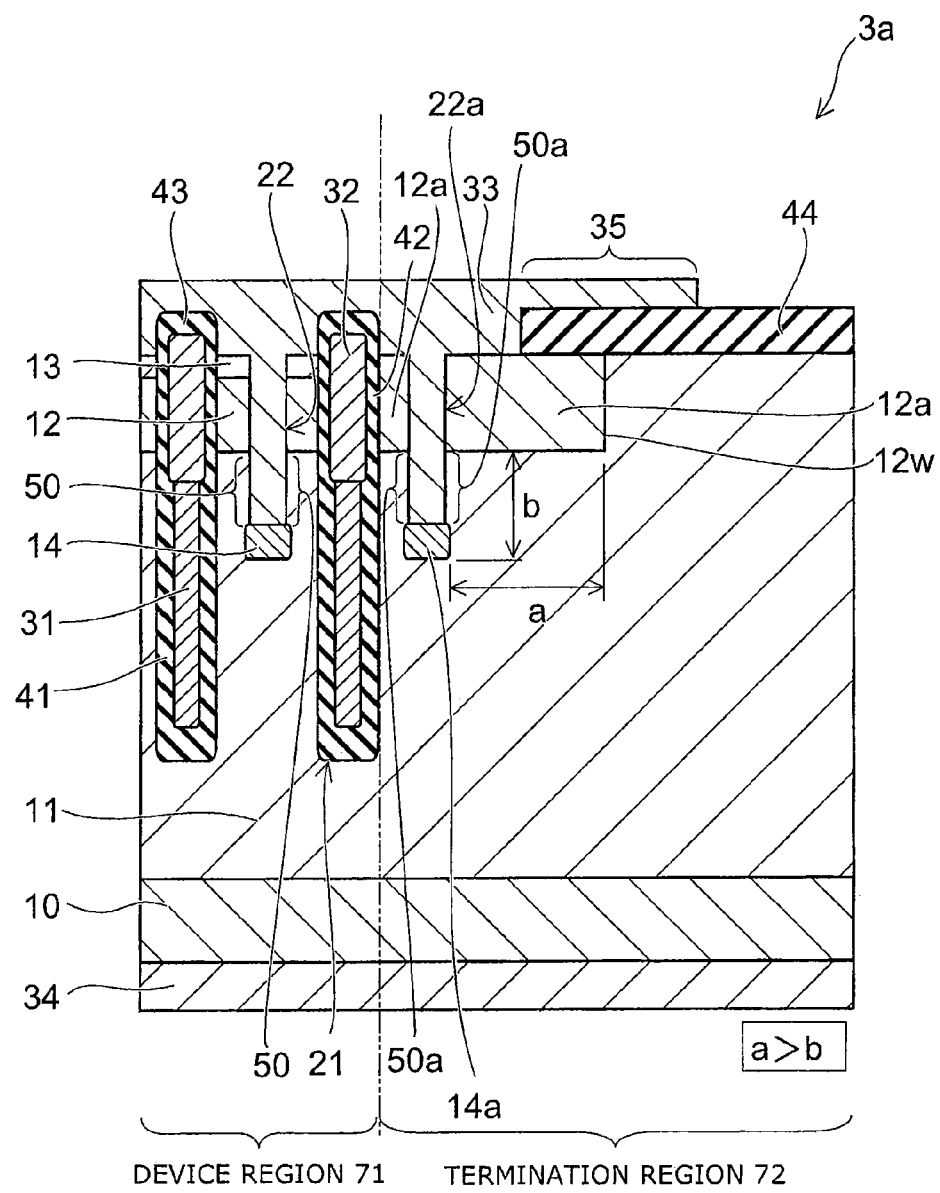
FIG. 10 is a schematic cross-sectional view of a main part of a semiconductor device according to a third embodiment.

FIG. 10 is a schematic cross-sectional view of a main part of a semiconductor device according to a third embodiment.

Figure 11:
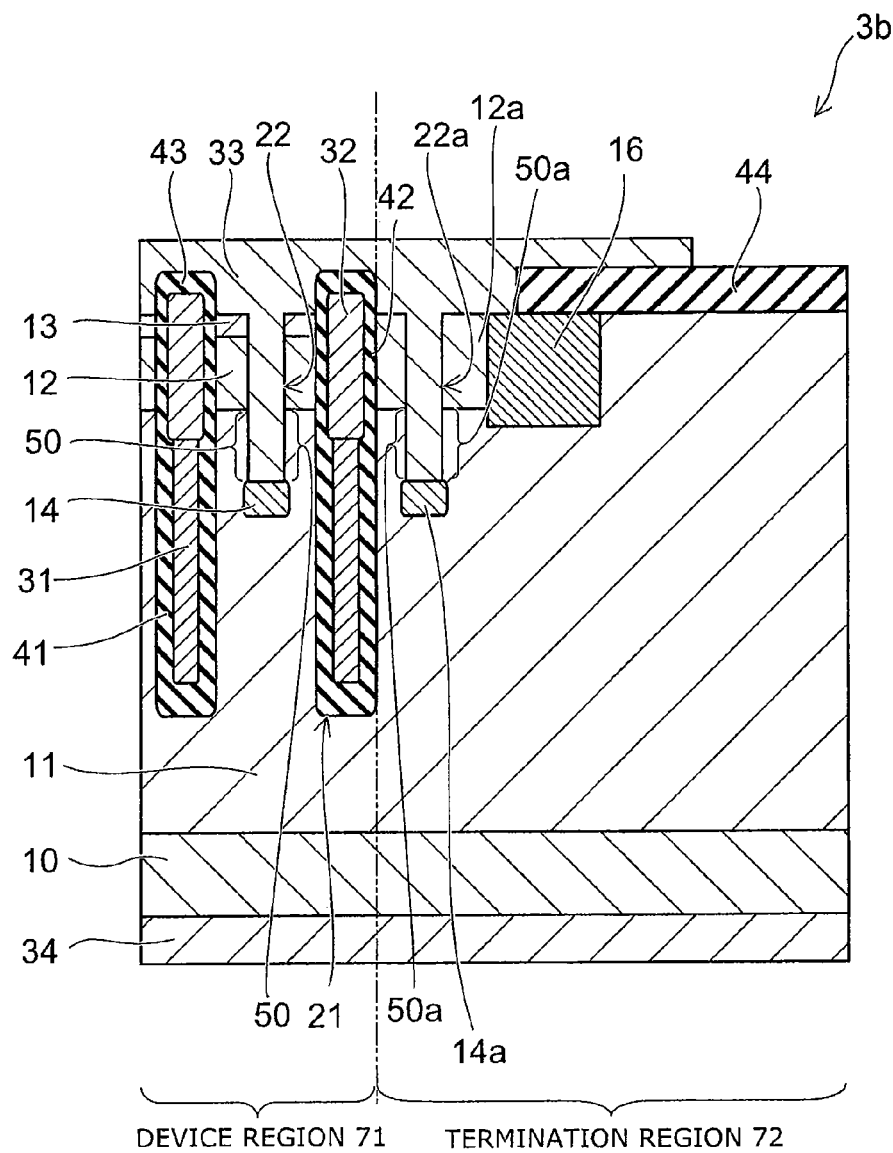
FIG. 11 is a schematic cross-sectional view of a main part of a semiconductor device according to a first variation of the third embodiment.
Figure 12:
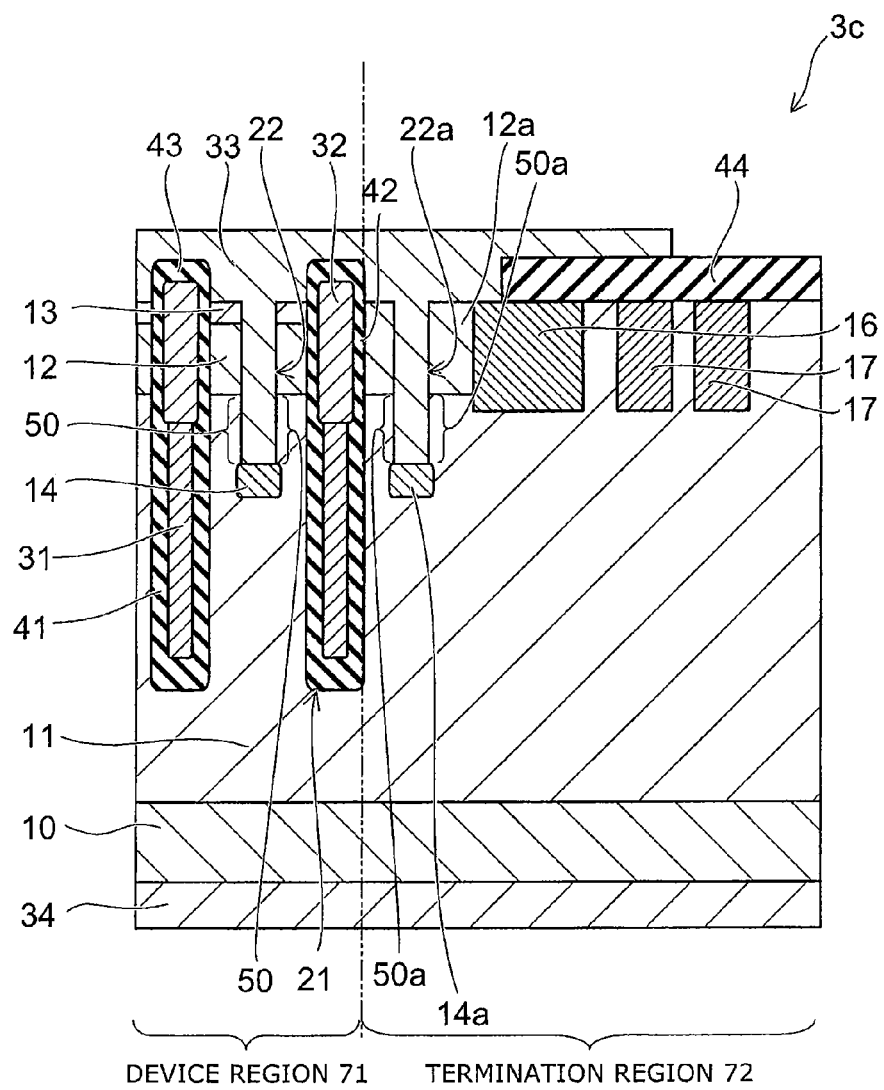
FIG. 12 is a schematic cross-sectional view of a main part of a semiconductor device according to a second variation of the third embodiment.

FIG. 10 shows not only a device region 71 having the MOSFET formed therein but also a termination region 72 outside the device region 71. Namely, the semiconductor device includes the device region 71 and the termination region 72 provided outside the device region 71 to surround the device region 71. The device region 71 is a region in which a main current path is formed between the drain electrode and the source electrode of the MOSFET, and for example, a region including the gate electrode 32 and the like in FIG. 10. The termination region 72 is a region provided outside the device region 71 to surround it, which is a region where a field plate electrode 35, a field insulating film 44, and the like described below are provided. In the termination region 72, the field insulating film 44 is further provided on the drift layer 11 and on a part of the base layer 12a. FIGS. 11 and 12 also show the foregoing configurations.

As shown in FIG. 10, in a semiconductor device 3a according to the embodiment, a field insulating film 44 is provided on the drift layer 11 in the termination region 72 outside the device region 71. On the field insulating film 44, the field plate electrode 35 integrally formed with the source electrode 33 is provided. The p-type base layer 12a is provided in the termination region 72 adjacent to the trench 21. The source layer 13 is not provided on the base layer 12a. The base layer 12a extends to a portion below the field insulating film.

In the base layer 12a, a trench 22a is provided to be closer to the trench 21 than a sidewall 12w where the base layer 12a contacts the drift layer 11. In other words, a distance between the trench 22a provided in the termination region 72 and the sidewall 12w where the base layer 12a provided in the termination region 72 contacts the drift layer 11 is longer than a distance between the trench 22a provided in the termination region and the trench 21 provided in the device region 71. The trench 22a divides the base layer 12a into parts. The lower end of the trench 22a is located at a position deeper than the bottom surface of the base layer 12a. The source electrode 33 is embedded in the trench 22a. The P⁺-type guard ring layer 14a is in contact with the lower end of the trench 22a. The guard ring layer 14a is connected to the source electrode 33 provided in the trench 22a. In a part of the sidewall of the trench 22a, the metallic source electrode 33 is in contact with the n⁻-type drift layer 11. As a result, the Schottky junction 50a is formed in the portion where the trench 22a is in contact with the drift layer 11.

The distance a from the sidewall 12w where the base layer 12a contacts the drift layer 11 to the sidewall of the trench 22a is longer than the distance b from the bottom surface of the base layer 12a to the lower end of the guard ring layer 14a. Other than the above, the device portion has the same configuration as that of the semiconductor device 1a.

When a high voltage is applied to the drain electrode 34, electric field concentrates on an end of the base layer 12a. Thus, a breakdown voltage of the semiconductor device 3a may be decreased. In the semiconductor device 3a, the concentration of the electric field is suppressed by the field plate structure in which the field plate electrode 35 is provided on the field insulating film 44. Furthermore, the electric field strength is moderated more by the guard ring layer 14a. Therefore, in the semiconductor device 3a, a reduction in breakdown voltage is suppressed.

Furthermore, by setting the distance a from the sidewall of the base layer 12a to the sidewall of the trench 22a to be longer than the distance b from the bottom surface of the base layer 12a to the lower end of the guard ring layer 14a, the concentration of the electric filed applied to the Schottky junction 50a on the guard ring layer 14a is moderated. As a result, it is possible to reduce a leakage current in the SBD.

Next, a variation of the semiconductor device 3a will be described.

First Variation of Third Embodiment

FIG. 11 is a schematic cross-sectional view of a main part of a semiconductor device according to a first variation of the third embodiment.

As shown in FIG. 11, a second guard ring layer (sixth semiconductor layer) 16 of the p-type semiconductor is provided on the surface of the drift layer 11 in a semiconductor device 3b. The second guard ring layer 16 is provided outside the base layer 12a to be in contact therewith. The surface of the second guard ring layer 16 is connected to the bottom surface of the source electrode 33. The lower end of the second guard ring layer 16 is located at a position deeper than the lower end of the base layer 12a.

With the foregoing structure, it is possible to further suppress the concentration of the electric field at the end of the base layer 12a by the second guard ring layer 16. FIG. 11 shows the guard ring layer 16 schematically in a rectangular shape. However, the ends of the actual junction are in fact rounded by the diffusion of impurities. The more the impurities are formed deeper, the larger the curvature radius becomes on the p-n junction interface, and the concentration of the electric field on the end of the p-n junction interface of the second guard ring layer 16 and the drift layer 11 is suppressed. As a result, the semiconductor device 3b realizes a high breakdown voltage in the termination region.

Second Variation of Third Embodiment

FIG. 12 is a schematic cross-sectional view of a main part of a semiconductor device according to a second variation of the third embodiment.

As shown in FIG. 12, in a semiconductor device 3c, a third guard ring layer 17 of the p-type semiconductor is provided outside the second guard ring layer 16. The third guard ring layer 17 is provided on the surface of the drift layer 11. The side face of the third guard ring layer is not in contact with the second guard ring layer 16. The surface of the third guard ring layer 17 is in contact with the field insulating film 44, and therefore is not in contact with the source electrode 33. Thus, the third guard ring layer 17 is not connected to any of the electrodes. The bottom surface of the third guard ring layer 17 is located at a position deeper than the bottom surface of the base layer 12a. One or a plurality of the third guard ring layers 17 may be provided.

By providing the third guard ring layer 17, it is possible to further suppress the concentration of the electric field onto the end of the base layer 12a, while further increasing the breakdown voltage in the termination region of the semiconductor device 3c.

In the foregoing, the embodiment of the invention has been described with reference to examples. However, the embodiment is not limited to these specific examples. More specifically, those skilled in the art can suitably modify these examples, and such modifications are also encompassed within the scope of the invention as long as they have the characteristic of the embodiment.

In the embodiment, the first conductivity type is indicated as the n-type, and the second conductivity type is indicated as the p-type. However, the first conductivity type may be indicated as the p-type, and the second conductivity type may be indicated as the n-type.

The planar pattern of the MOS gate section and the embedded FP structure is not limited to the stripe pattern, and may be of a grid pattern, a zigzag pattern or a honeycomb pattern.

In the foregoing, silicon (Si) has been described as a semiconductor material for the semiconductor device. However, for instance, compound semiconductors such as silicon carbide (SiC) and gallium nitride (GaN), and wide bandgap semiconductors such as diamond can be used as the semiconductor material.

Moreover, the drawings given by way of examples in the embodiment are schematic or conceptual. The ratio of the thickness to the width of each part, ratio in size between parts are not necessarily be identical with the reality, and for example, rectangular shapes in the drawings may be rounded or may have angles in reality. Such modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a first semiconductor layer of a first conductivity type;
   a second semiconductor layer of a second conductivity type provided on the first semiconductor layer;
   a third semiconductor layer of the first conductivity type provided on the second semiconductor layer;
   an embedded electrode provided in a first trench via a first insulating film, the first trench penetrating through the second semiconductor layer from a surface of the third semiconductor layer to reach the first semiconductor layer;
   a control electrode provided above the embedded electrode via a second insulating film in the first trench;
   a fourth semiconductor layer of the second conductivity type selectively provided in the first semiconductor layer and connected to a lower end of a second trench, the second trench penetrating through the second semiconductor layer from the surface of the third semiconductor layer to reach the first semiconductor layer;
a first main electrode electrically connected to the first semiconductor layer; and
a second main electrode provided in the second trench and connected to the second semiconductor layer, the third semiconductor layer and the fourth semiconductor layer,
the embedded electrode being electrically connected to one of the second main electrode and the control electrode,
a Schottky junction formed of the second main electrode and the first semiconductor layer being formed at a sidewall of the second trench.

2. The device according to claim 1, wherein the embedded electrode is connected to the control electrode.

3. The device according to claim 1, wherein the lower end of the second trench is located at a position deeper than a lower end of the control electrode.

4. The device according to claim 1, further comprising
a fifth semiconductor layer of the first conductivity type provided on a lower side of the second semiconductor layer between the first trench and the second trench and containing an impurity having an impurity concentration higher than an impurity concentration of the first semiconductor layer.

5. The device according to claim 4, wherein a lower end of the fifth semiconductor layer is located at a position shallower than a lower end of the fourth semiconductor layer.

6. The device according to claim 4, wherein the fifth semiconductor layer is in contact with the second trench.

7. The device according to claim 4, wherein the fifth semiconductor layer is not in contact with the second trench.

8. The device according to claim 1, wherein the second semiconductor layer, the second main electrode provided in the second trench, and the fourth semiconductor layer connected to the second main electrode are provided in a termination region around a device region, the control electrode being provided in the device region.

9. The device according to claim 8, wherein a field insulating film is further provided on the first semiconductor layer and on a part of the second semiconductor layer in the termination region.

10. The device according to claim 8, wherein a distance between the second trench in the termination region and a sidewall of the termination region where the second semiconductor layer contacts the first semiconductor layer is longer than a distance between the second trench in the termination region and the first trench in the device region.

11. The device according to claim 8, wherein the second semiconductor layer in the termination region is divided by the second trench in the termination region.

12. The device according to claim 8, wherein the lower end of the second trench in the termination region is located at a position deeper than a bottom surface of the second semiconductor layer in the termination region.

13. The device according to claim 8, wherein the second main electrode provided in the second trench in the termination region is in contact with the first semiconductor layer.

14. The device according to claim 8, wherein a distance from a sidewall of the second semiconductor layer extending from the device region to the termination region to a sidewall of the second trench facing the sidewall of the second semiconductor layer is longer than a distance from a bottom surface of the second semiconductor layer to a lower end of the fourth semiconductor layer.

15. The device according to claim 8, further comprising
a sixth semiconductor layer of the second conductivity type provided on a surface of the first semiconductor layer and being in contact with the second semiconductor layer extending from the device region to the termination region.

16. The device according to claim 15, wherein a bottom surface of the sixth semiconductor layer is located at a position deeper than a bottom surface of the second semiconductor layer in the termination region.

17. The device according to claim 15, wherein the sixth semiconductor layer is connected to the second main electrode.

18. The device according to claim 15, further comprising
at least one seventh semiconductor layer of the second conductivity type provided further outside the sixth semiconductor layer and not connected to the second main electrode.

19. The device according to claim 18, wherein the seventh semiconductor layer is not in contact with the sixth semiconductor layer.

20. The device according to claim 18, wherein a bottom surface of the seventh semiconductor layer is located at a position deeper than a bottom surface of the second semiconductor layer in the termination region.

* * * * *